(12) United States Patent
James et al.

(10) Patent No.: US 9,326,426 B2
(45) Date of Patent: Apr. 26, 2016

(54) EQUIPMENT ENCLOSURE WITH AIR DIVERTER TEMPERATURE CONTROL SYSTEM

(75) Inventors: Lewis G. James, Clarence, NY (US); Aron J. King, Alden, NY (US); David H. Halik, Cheektowaga, NY (US)

(73) Assignee: Diversified Control, Inc., Orchard Park, NY (US)

( * ) Notice: Subject to any disclaimer, the term of this patent is extended or adjusted under 35 U.S.C. 154(b) by 601 days.

(21) Appl. No.: 13/253,243

(22) Filed: Oct. 5, 2011

(65) Prior Publication Data

US 2013/0087320 A1    Apr. 11, 2013

(51) Int. Cl.
*H05K 5/00*   (2006.01)
*H05K 7/20*   (2006.01)

(52) U.S. Cl.
CPC .................................. *H05K 7/20572* (2013.01)

(58) Field of Classification Search
CPC .......................... H05K 7/20572; H05K 7/207
USPC ........................... 454/184, 193, 185; 165/253
See application file for complete search history.

(56) References Cited

U.S. PATENT DOCUMENTS

| | | | | |
|---|---|---|---|---|
| 4,338,996 A | * | 7/1982 | Frank | 165/57 |
| 5,832,988 A | * | 11/1998 | Mistry et al. | 165/103 |
| 5,886,296 A | * | 3/1999 | Ghorbani et al. | 174/50 |
| 5,934,368 A | * | 8/1999 | Tanaka et al. | 165/233 |
| 6,026,891 A | * | 2/2000 | Fujiyoshi et al. | 165/104.33 |
| 6,105,875 A | * | 8/2000 | LaGrotta et al. | 236/44 A |
| 6,119,768 A | * | 9/2000 | Dreier et al. | 165/104.33 |
| 6,123,266 A | * | 9/2000 | Bainbridge et al. | 236/49.3 |
| 6,127,663 A | * | 10/2000 | Jones | 219/553 |
| 6,164,369 A | * | 12/2000 | Stoller | 165/104.33 |
| 6,407,533 B1 | * | 6/2002 | Bartek et al. | 320/150 |
| 6,533,031 B1 | * | 3/2003 | Garcia et al. | 165/263 |
| 6,598,668 B1 | * | 7/2003 | Cosley et al. | 165/104.32 |
| 6,628,520 B2 | * | 9/2003 | Patel et al. | 361/696 |
| 6,700,780 B2 | * | 3/2004 | Hedberg et al. | 361/695 |
| 6,704,198 B2 | * | 3/2004 | Replogle et al. | 361/690 |
| 6,742,583 B2 | * | 6/2004 | Tikka | 165/291 |
| 6,877,551 B2 | * | 4/2005 | Stoller | 165/47 |
| 6,885,554 B1 | * | 4/2005 | Reeck et al. | 361/695 |
| 6,889,752 B2 | * | 5/2005 | Stoller | 165/47 |
| 6,936,372 B1 | * | 8/2005 | Jagota et al. | 429/50 |
| 7,180,738 B2 | * | 2/2007 | Mandel et al. | 361/695 |
| 7,222,660 B2 | * | 5/2007 | Giacoma et al. | 165/47 |
| 7,455,706 B2 | * | 11/2008 | Latham et al. | 55/385.1 |
| 7,929,294 B2 | * | 4/2011 | Yeh et al. | 361/679.5 |

(Continued)

*Primary Examiner* — Steven B McAllister
*Assistant Examiner* — Jonathan Cotov
(74) *Attorney, Agent, or Firm* — Walter W. Duft

(57) ABSTRACT

An equipment enclosure includes an air exhaust opening and an air intake opening at respective upper and lower regions of the enclosure, and an interior equipment chamber configured to house controlled temperature equipment at a controlled temperature equipment area. A temperature diverter system includes a warm air exhaust subsystem and a warm air circulation subsystem. The warm air exhaust subsystem is operable to vent warm air in the enclosure through the air exhaust opening in order to cool the controlled temperature equipment area. The warm air circulation subsystem is operable to circulate warm air in the enclosure to the controlled temperature equipment area in order to warm that area. The equipment enclosure further includes one or more temperature sensors and a temperature controller for controlling operations of the warm air exhaust subsystem and the warm air circulation system based on input from the temperature sensor(s).

22 Claims, 13 Drawing Sheets

(56) References Cited

U.S. PATENT DOCUMENTS

| | | | |
|---|---|---|---|
| 7,974,094 B2 * | 7/2011 | Hendrix et al. | 361/695 |
| 8,072,752 B2 * | 12/2011 | Wantschik | 361/695 |
| 8,072,780 B1 * | 12/2011 | Roy | 361/825 |
| 8,251,136 B2 * | 8/2012 | Shibata et al. | 165/244 |
| 8,313,038 B2 * | 11/2012 | Therrien et al. | 236/49.2 |
| 8,408,356 B2 * | 4/2013 | Yamaguchi et al. | 181/198 |
| 2007/0289976 A1 * | 12/2007 | Meyer et al. | 220/592.09 |
| 2008/0055849 A1 * | 3/2008 | Lee | 361/695 |
| 2008/0068798 A1 * | 3/2008 | Hendrix et al. | 361/696 |
| 2008/0212286 A1 * | 9/2008 | Komatsu | 361/714 |
| 2008/0239668 A1 * | 10/2008 | Hendrix et al. | 361/695 |
| 2009/0020618 A1 * | 1/2009 | Gutierrez et al. | 236/49.3 |
| 2009/0311951 A1 * | 12/2009 | Walkinshaw | 451/261 |
| 2010/0206065 A1 * | 8/2010 | Hsiao et al. | 73/170.12 |
| 2011/0086589 A1 * | 4/2011 | Skrepcinski et al. | 454/184 |
| 2013/0035031 A1 * | 2/2013 | Therrien et al. | 454/257 |

* cited by examiner

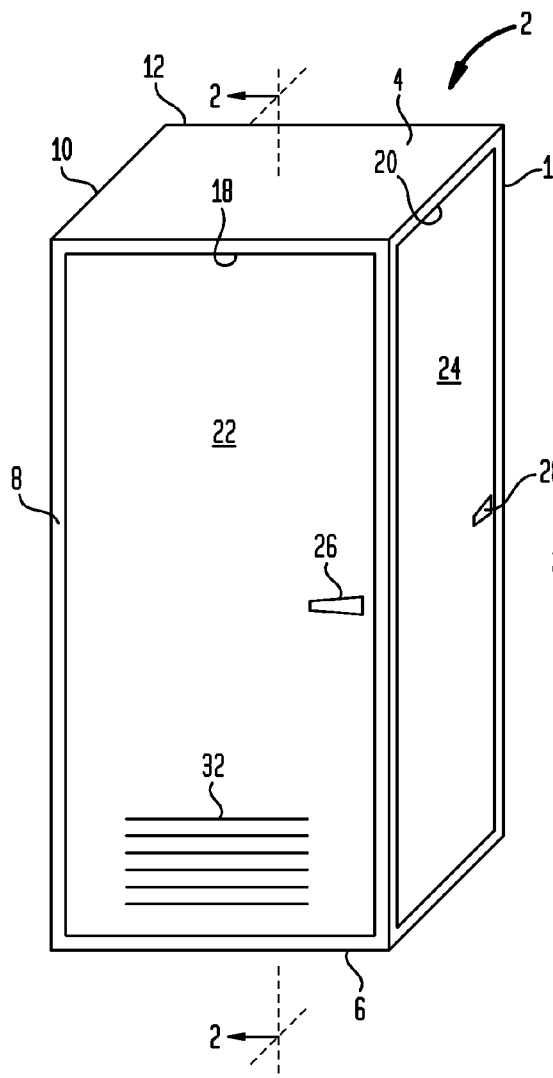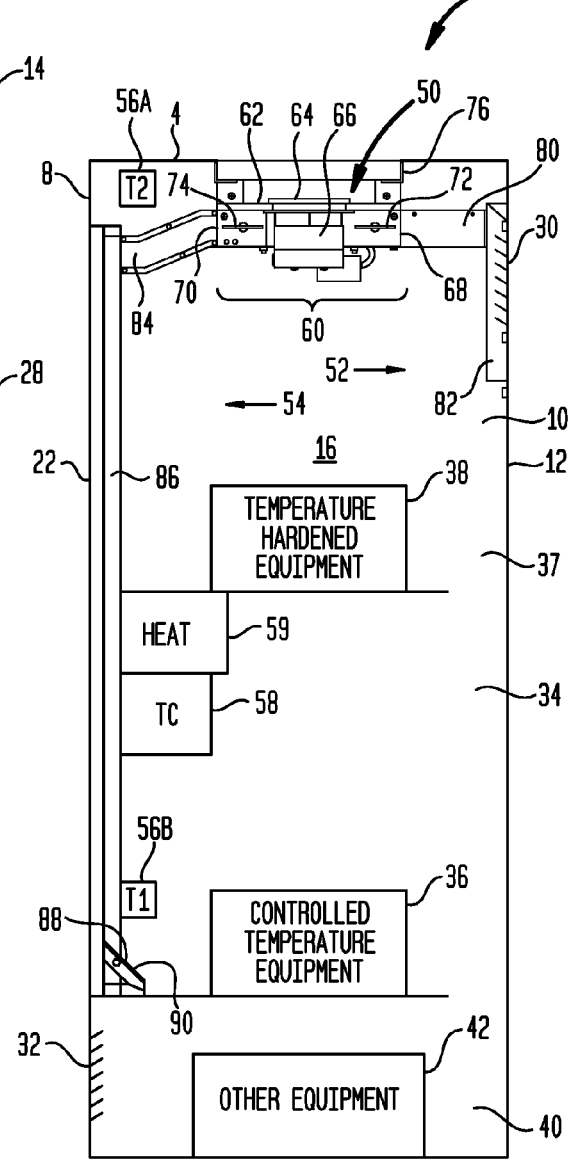

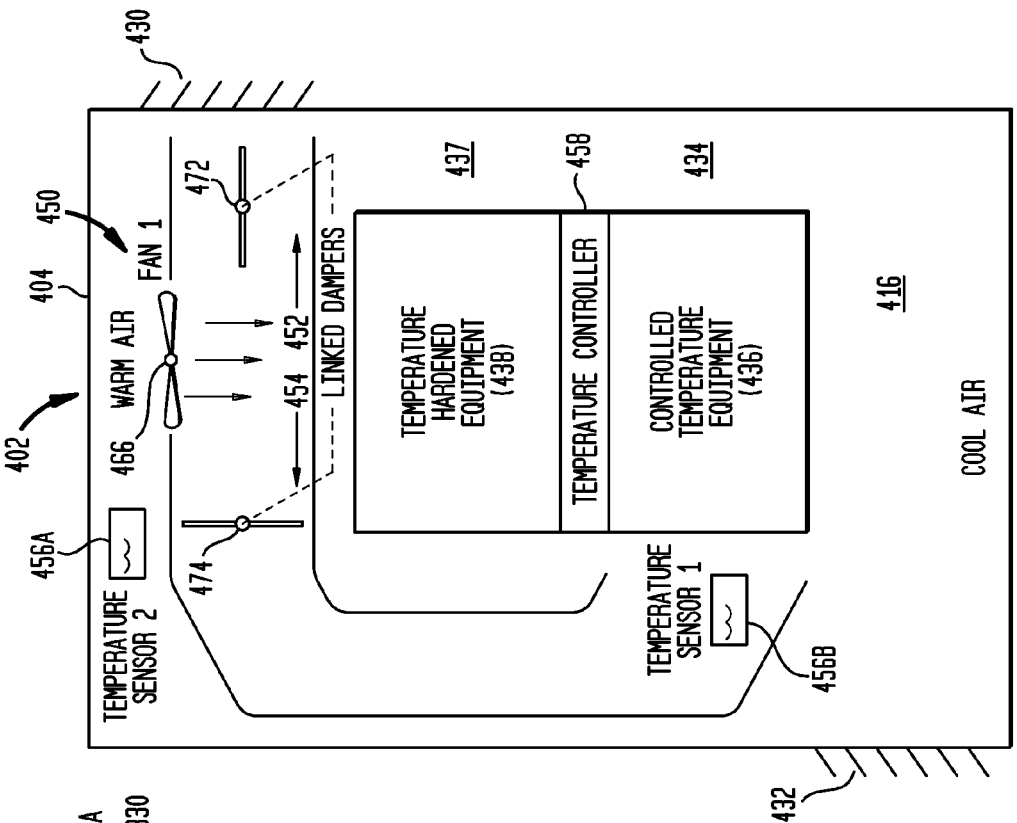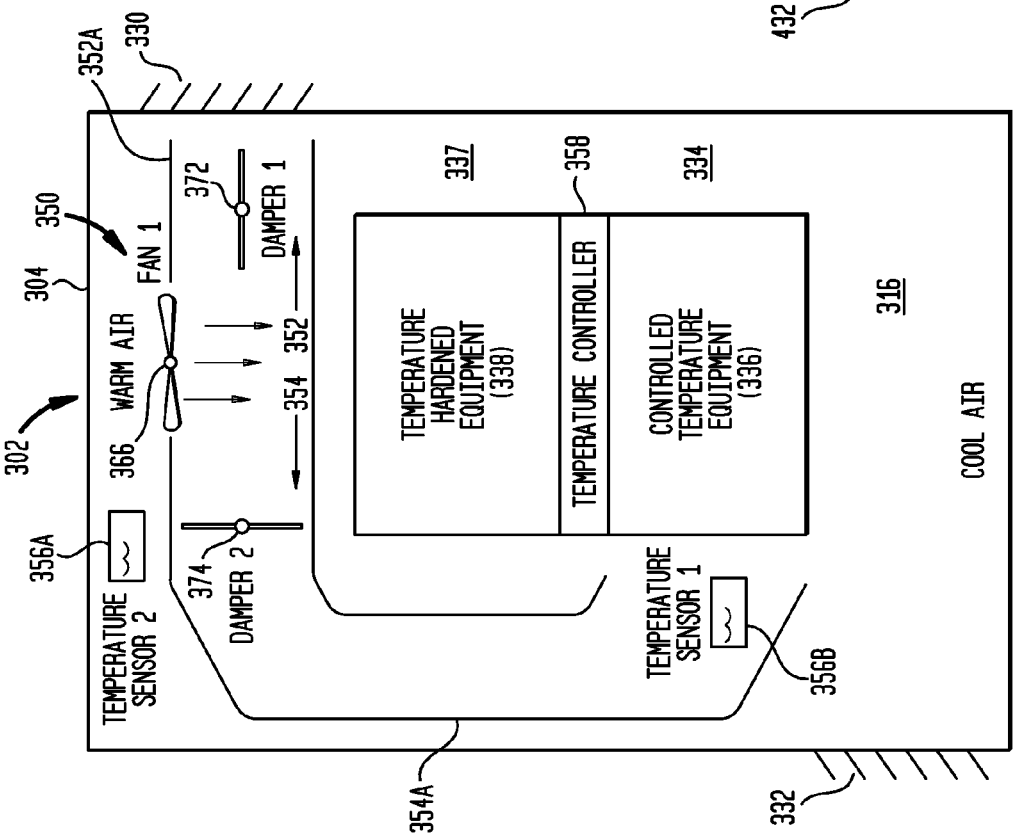

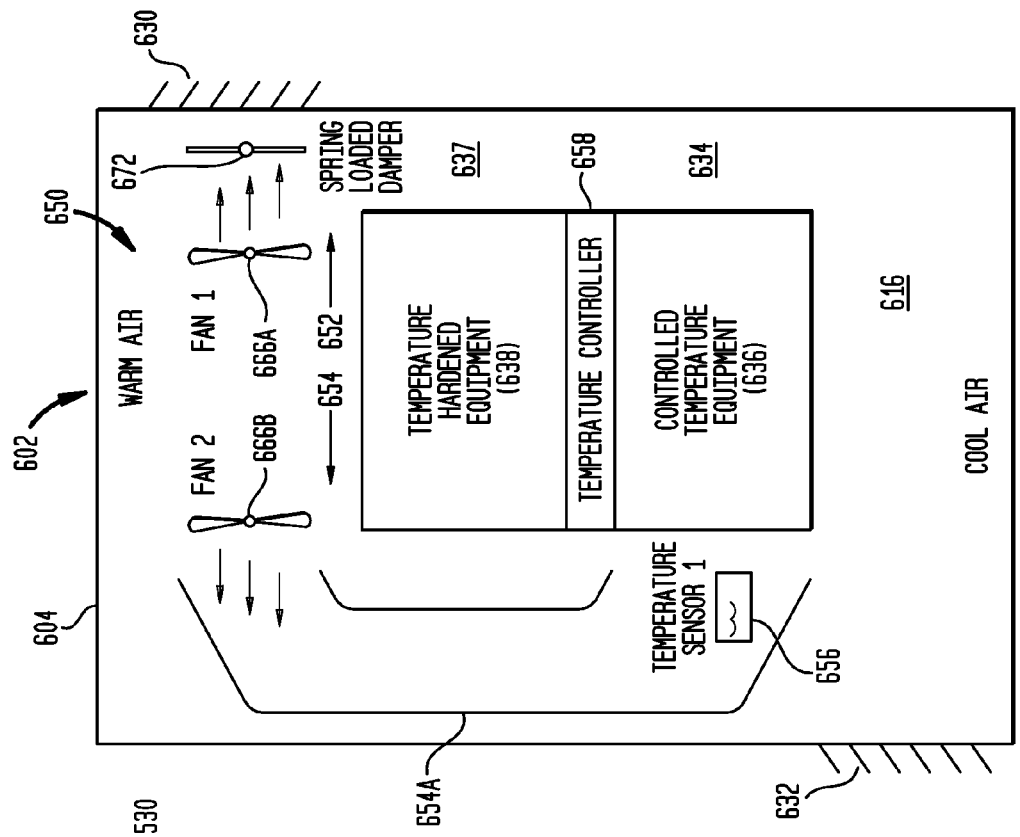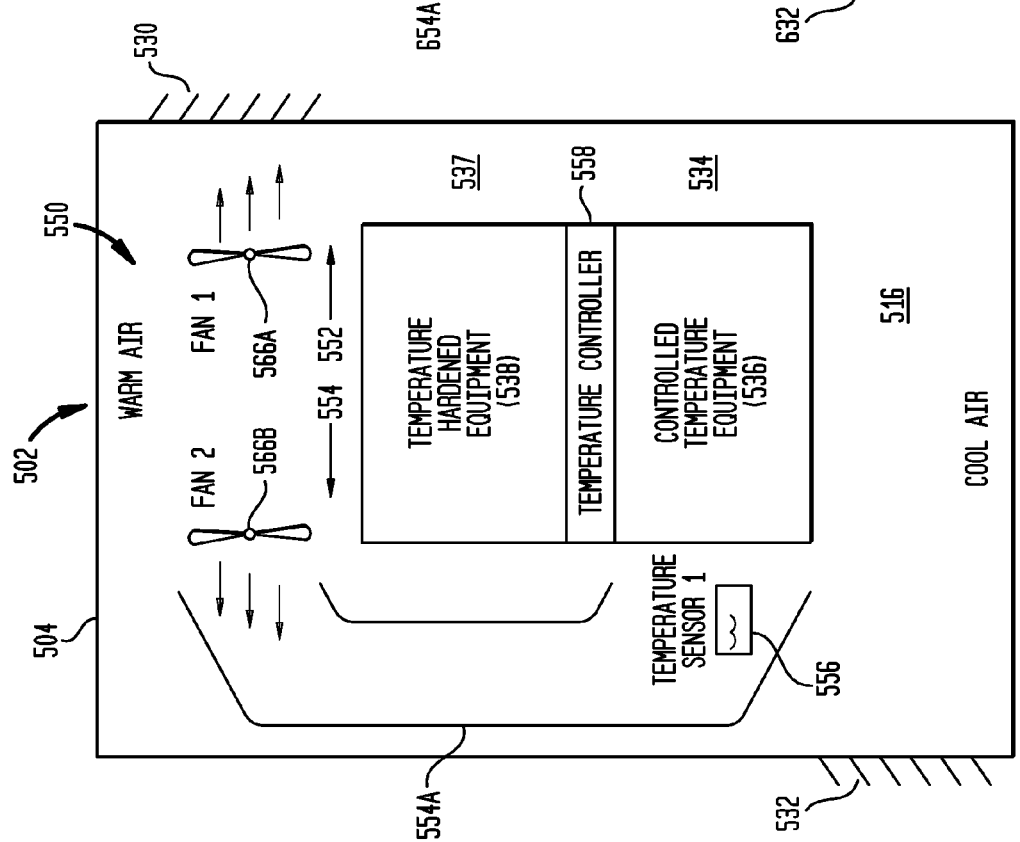

EQUIPMENT ENCLOSURE WITH AIR DIVERTER TEMPERATURE CONTROL SYSTEM

BACKGROUND

1. Field of the Disclosure

The present disclosure relates to equipment enclosures. More particularly, the disclosure concerns enclosures with temperature control apparatus for maintaining temperature controlled equipment within a desired temperature range despite fluctuations in environmental temperature conditions outside the enclosure.

2. Description of the Prior Art

By way of background, equipment enclosures are often used to house temperature controlled equipment that is designed to operate most efficiently within a prescribed temperature range. Examples include, but are not limited to, enclosures for cellular communications equipment and other apparatus. Such equipment enclosures usually include some type of temperature control functionality in order to provide cooling in hot weather and heating in cold weather. Existing temperature control solutions range from simple fans to complex air conditioning and heating units. Fan systems are inexpensive and have low power demand, but often provide inadequate temperature control. Air conditioning and heating units provide superior temperature control, but are comparatively expensive and have high power demand. It is to improvements in equipment enclosure temperature control that the present disclosure is directed. In particular, the disclosure presents a novel equipment enclosure and temperature control system that is superior to existing fan devices while requiring substantially less power than conventional air conditioning and heating units.

SUMMARY

In a first aspect of the disclosure, an improved equipment enclosure includes an air exhaust opening disposed at an upper region of the enclosure, an air intake opening disposed at a lower region of the enclosure, and an interior equipment chamber configured to house controlled temperature equipment at a controlled temperature equipment area therein. A temperature diverter system includes a warm air exhaust subsystem and a warm air circulation subsystem. The warm air exhaust subsystem is operable to vent warm air in the equipment enclosure through the air exhaust opening in order to cool the controlled temperature equipment area. The warm air circulation subsystem is operable to circulate warm air in the equipment enclosure to the controlled temperature equipment area in order to warm that area. The equipment enclosure further includes one or more temperature sensors and a temperature controller for controlling operations of the warm air exhaust subsystem and the warm air circulation system based on input from the one or more temperature sensors.

In a further aspect of the disclosure, an improved equipment enclosure includes an interior equipment chamber, a temperature diverter system, and temperature control logic. The temperature diverter system includes a warm air receiver disposed at a warm air collecting area of the interior equipment chamber and two or more warm air subsystems operable to direct warm air collected by the warm air receiver to two or more areas of the equipment enclosure in order to provide a desired warming or cooling effect. The temperature control logic is operable to control operations of the two or more warm air subsystems in order to selectively direct warm air to the two or more areas of the equipment enclosure.

BRIEF DESCRIPTION OF THE DRAWINGS

The foregoing and other features and advantages will be apparent from the following more particular description of example embodiments, as illustrated in the accompanying Drawings, in which:

FIG. 1 is a perspective view showing an example equipment enclosure that may be constructed according to the present disclosure;

FIG. 2 is a cross-sectional view taken along line 2-2 in FIG. 1;

FIG. 15 is a diagrammatic view of a generic equipment enclosure that may be constructed according to the present disclosure;

FIG. 16 is a diagrammatic view showing a modification of the equipment enclosure of FIG. 15;

FIG. 17 is a diagrammatic view of a further generic equipment enclosure that may be constructed according to the present disclosure; and FIG. 18 is a diagrammatic view showing a modification of the equipment enclosure of FIG. 17.

DETAILED DESCRIPTION OF EXAMPLE EMBODIMENTS

Figure 3:
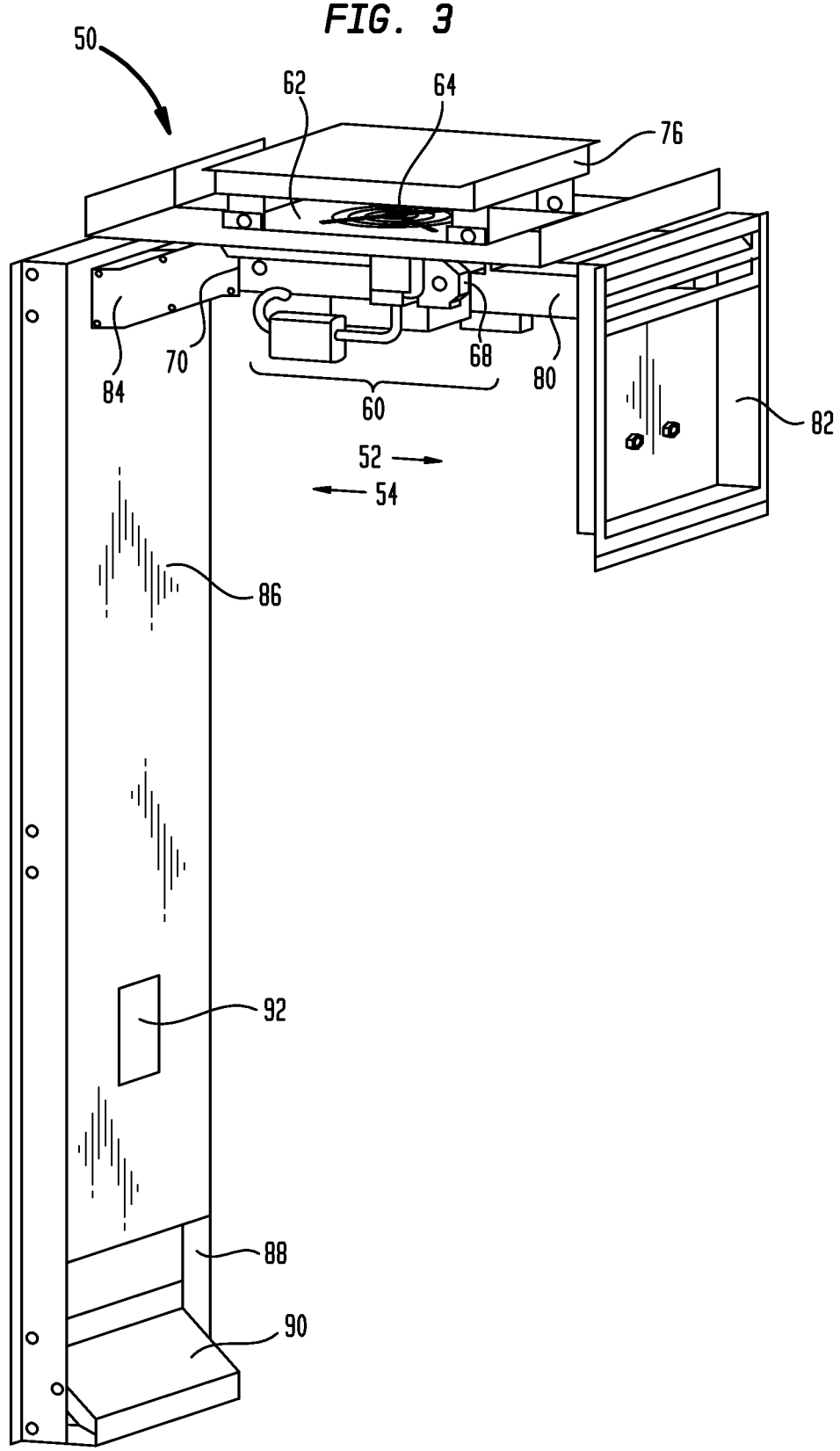
FIG. 3 is a perspective view showing an example temperature diverter system that may be used in the equipment enclosure of FIG. 1.

Turning now to the drawing figures, which are not necessarily to scale, like reference numerals are used to represent like elements in all of the several views. FIGS. 1 and 2 illustrate one example embodiment of an improved equipment enclosure 2 that could be constructed in accordance with the present disclosure. The equipment enclosure 2 may be constructed from any suitable material, including but not limited to, steel, aluminum, plastic, etc., depending on its intended application. Although the equipment enclosure 2 will typically be used for outdoor applications, it may also be used indoors. In the illustrated embodiment, the equipment enclosure 2 is configured with a top panel 4, a bottom panel 6 and four side panels 8, 10, 12 and 14 that define an interior equipment chamber 16 (see FIG. 2). Other enclosure configurations may also be used. One or more of the side panels 8-14 may be formed with openings that allow access to the interior equipment chamber 16. For example, FIG. 1 illustrates a first access opening 18 formed on side panel 8 and a second access opening 20 formed on side panel 14. A first service door 22 covers access opening 18 and a second service door 24 covers access opening 20. The service doors 22 and 24 can be mounted to the equipment enclosure 2 using hinges (not shown) and may be respectively opened using door handles 26 and 28. Other attachment and opening arrangements may also be used.

As can be seen in FIG. 2, the equipment enclosure 2 includes a louvered air exhaust opening 30 disposed at an upper region of the enclosure and a louvered air intake opening 32 disposed at a lower region of the enclosure. Non-louvered openings could also be used, particularly if the equipment enclosure 2 is for use in an area that is not exposed to rain, snow, etc., such as within buildings or other protective structures. It is preferred that the air exhaust opening 30 be located above the air intake opening 32, although other location arrangements could also be used. The interior equipment chamber 16 is configured to house one or more items of equipment at one or more equipment holding areas therein. One such holding area is a controlled temperature equipment area 34 that houses controlled temperature equipment 36. In the embodiment of FIGS. 1 and 2, the controlled temperature area 34 may be located anywhere below the air exhaust opening 30 and above the air intake opening 32. Other locations could potentially also be used. As used herein, "controlled temperature equipment" refers to any equipment, device or component that is sensitive to temperature and therefore needs to be maintained in a controlled temperature environment. Another equipment area 37 of the interior equipment chamber 16 may be used for housing temperature hardened equipment 38. As used herein, "temperature hardened equipment" refers to any equipment, device or component that is not sensitive to temperature and therefore does not need to be maintained in a controlled temperature environment. The temperature hardened equipment area 37 is located above the controlled temperature equipment area 34 in FIGS. 1 and 2, but could be located elsewhere within the interior equipment chamber 16 if desired. In example applications of the equipment enclosure 2, the controlled temperature equipment 36 and/or the temperature hardened equipment 38 will typically comprise heat-generating apparatus that generates heat during operation. A further equipment area 40 of the interior equipment chamber 16 may be used for housing other equipment 42 that typically does not generate heat. The non-heat generating equipment area 40 is positioned at the bottom of the equipment enclosure 2 in FIGS. 1 and 2, but could be located elsewhere within the interior equipment chamber 16 if desired.

The equipment enclosure 2 includes a temperature diverter system 50 that may be configured according to an example embodiment in the manner shown in FIG. 2. As will be described in more detail below, the components of the temperature diverter system 50 are arranged to provide a warm air exhaust subsystem 52 and a warm air circulation subsystem 54. The warm air exhaust subsystem 52 is operable to vent warm air within the equipment enclosure 2 through the air exhaust opening 30 in order to cool the controlled temperature equipment area 34. The warm air circulation subsystem 54 is operable to circulate warm air within the equipment enclosure to the controlled temperature equipment area 34 in order to warm that area. The temperature diverter system 50 operates in conjunction with one or more temperature sensors, including but not limited to a fan temperature sensor 56A and an equipment temperature sensor 56B. The operations of the temperature diverter system 50 are managed by a temperature controller (TC) 58 that may be embodied in any suitable manner, including as a programmed microprocessor or central processing unit (CPU), a field programmable gate array (FPGA), an application specific integrated circuit (ASIC), etc. The temperature controller 58 control the operations of the warm air exhaust subsystem 52 and the warm air circulation system 54 based on inputs received from the temperature sensors 56A and 56B. The temperature diverter system 50 may further operate in conjunction with an optional heater 59.

Figure 4:
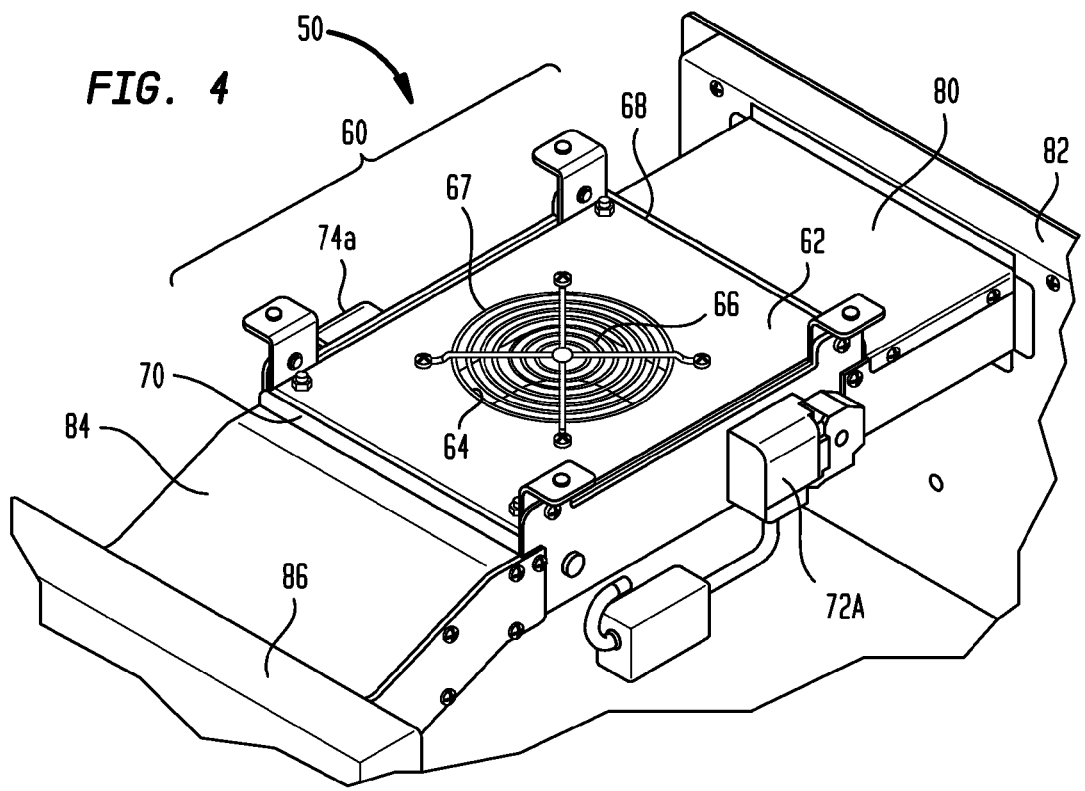
FIG. 4 is an enlarged perspective view showing a portion of the temperature diverter system of FIG. 3 in a fully assembled state.
Figure 5:
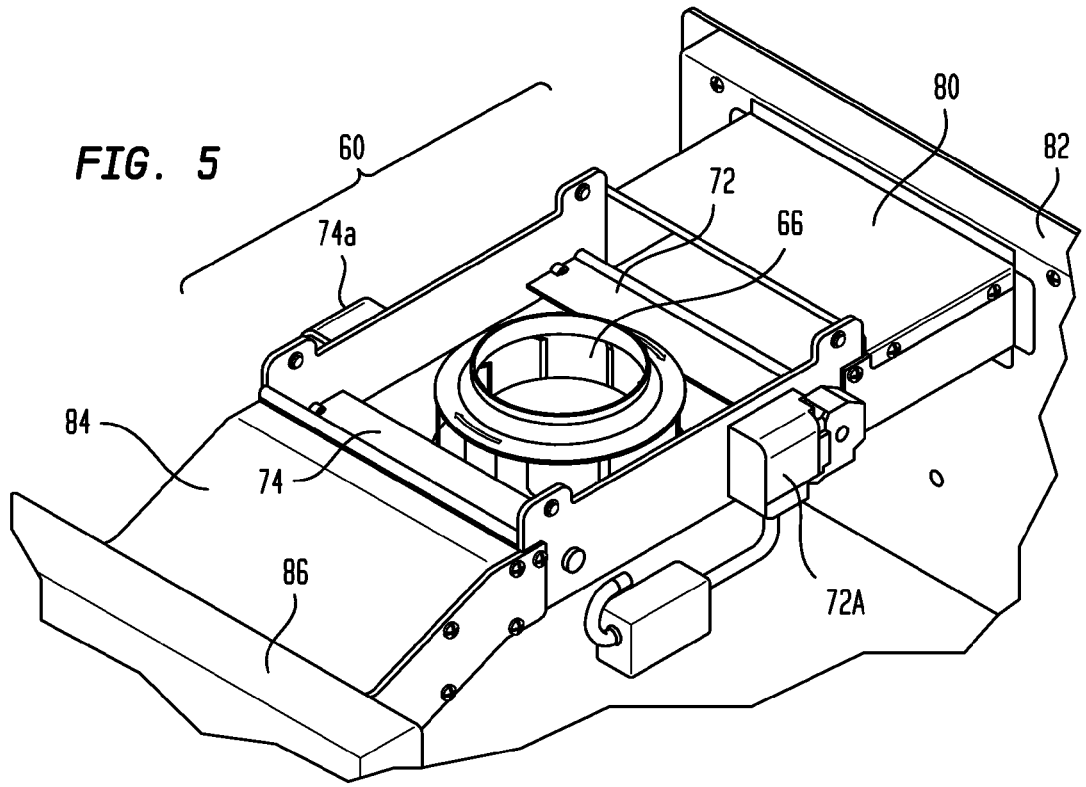
FIG. 5 is an enlarged top view showing a portion of the temperature diverter system of FIG. 3 in a partially disassembled state.
Figure 6:
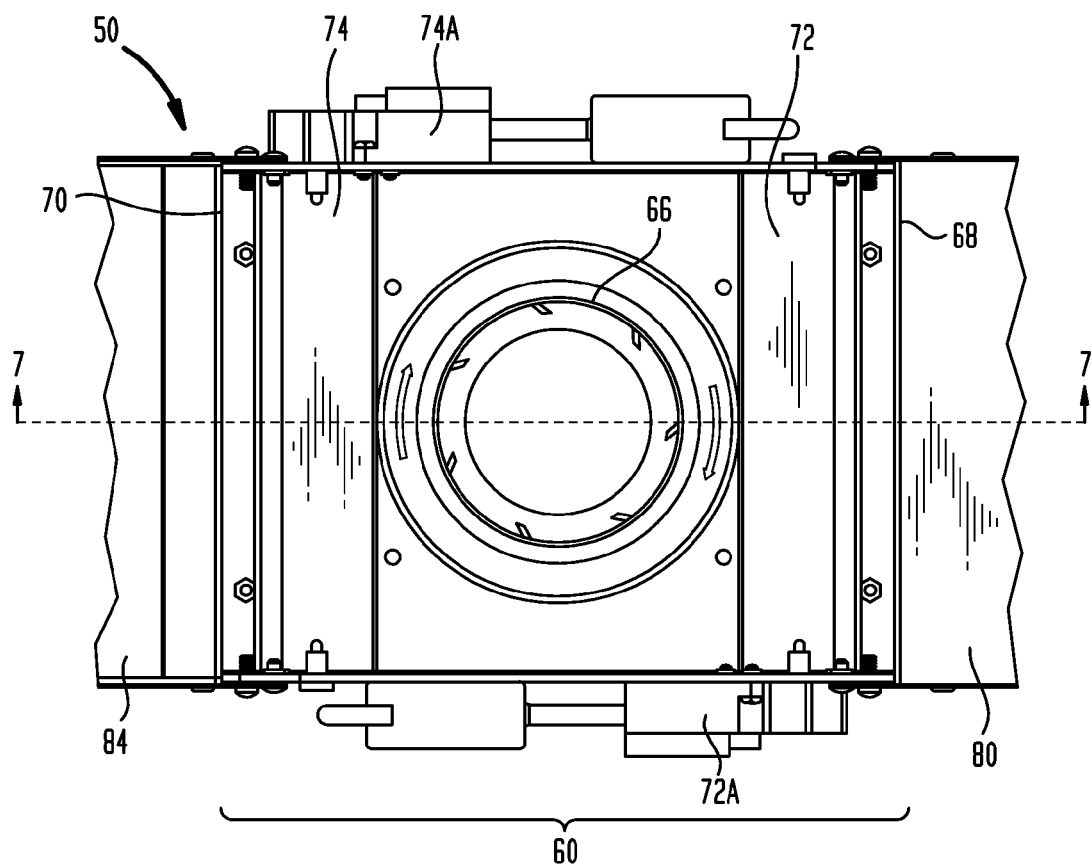
FIG. 6 is an enlarged top view of a portion of the temperature diverter system of FIG. 3 in a partially disassembled state.
Figure 7:
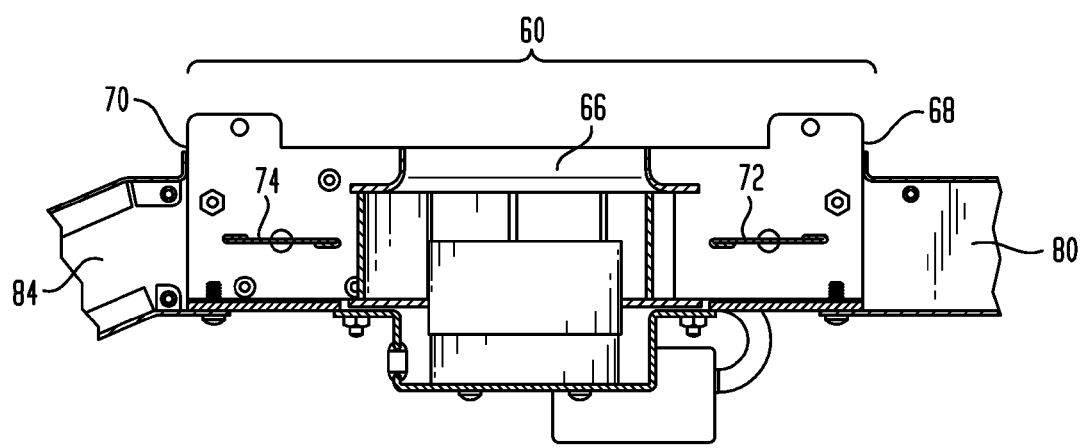
FIG. 7 is a cross-sectional view taken along line 7-7 in FIG. 6.

With additional reference now to FIGS. 3-7, the temperature diverter system 50 includes a centrally located air receiver unit 60. The air receiver unit 60 may be configured as a box-shaped plenum structure or manifold 62 that is formed with an upper air receiving port 64 of circular shape. The air receiving port 64 is arranged to receive warm air that collects at the top of the equipment chamber 16 within the equipment enclosure 2. As can be seen in FIGS. 4-7, a centrifugal fan 66 in the air receiver unit 60 provides a high pressure air mover that is common to both the warm air exhaust subsystem 52 and the warm air circulation subsystem 54. As best shown in FIGS. 4-5, the fan 66 may be situated below a fan cover 67 that is secured on top of the plenum structure 62 to cover the air receiving port 64. As best shown in FIGS. 5-7, the fan 66 draws air downwardly from the air receiving port 64 into a central interior portion of the plenum structure 62, then redirects the air through an angle of substantially 90 degrees so that it flows radially outwardly toward respective discharge ports 68 (exhaust discharge port) and 70 (circulation discharge port) of the plenum structure. As additionally shown in FIGS. 5-7 (as well as in FIG. 2), the air receiver unit 60 further includes within its plenum structure 62 a first movable damper 72 that is part of the warm air exhaust subsystem 52 and a second movable damper 74 that is part of the warm air circulation subsystem 54. The damper 72 is located proximate to the exhaust discharge port 68 and is rotated by a first damper drive motor 72A. The damper 74 is located proximate to the circulation discharge port 70 and is rotated by a second damper drive motor 74A. As described in more detail below, the respective rotational positions of the dampers 72 and 74 determine whether warm air will be directed to the warm air exhaust subsystem 52, or to the warm air circulation system 54, or to both subsystems simultaneously. The damper motors 72A and 74A respectively set the rotational positions of the dampers 72 and 74 based on control inputs from the temperature controller 58. In an example embodiment, the damper motors 72A and 74A may be implemented as multi-position stepper motors that can respectively rotate the dampers 72 and 74 through a range of positions.

Returning now to FIGS. 2 and 3, the air diverter system 50 may be provided with an enclosure interface structure 76 that is disposed between the top panel 4 of the equipment enclosure 2 and the air receiver unit 60. The air diverter system 50 further includes additional components that provide portions of the warm air exhaust subsystem 52 and the warm air circulation system 54. With respect to the warm air exhaust subsystem 52 (and as additionally shown in FIGS. 4-7), the exhaust discharge port 68 of the plenum structure 62 interfaces with an exhaust plenum 80 that provides a closed air pathway of the warm air exhaust subsystem 52. The exhaust plenum 80 extends to an enlarged venting plenum 82 that encloses the interior side of the equipment enclosure's air exhaust opening 30. With respect to the warm air circulation system (and as additionally shown in FIGS. 4-7), the circulation discharge port 70 of the plenum structure 62 interfaces with a first circulation plenum 84. The first circulation plenum connects to a second circulation plenum 86 that extends downwardly to a circulation discharge opening 88 situated in the controlled temperature equipment area 34. An angled flow diverter plate 90 is positioned at the circulation discharge opening 88 to redirect warm air flowing downwardly through the second circulation plenum 86 through a substantially 90 degree angle so that the air flows in the direction of the controlled temperature equipment 36. In an example embodiment, a cutout opening 92 (see FIG. 3) may be formed in the second circulation plenum to receive warm air from the heater 58, which may be positioned to line up with the opening, or could be mounted thereto.

Figure 8:
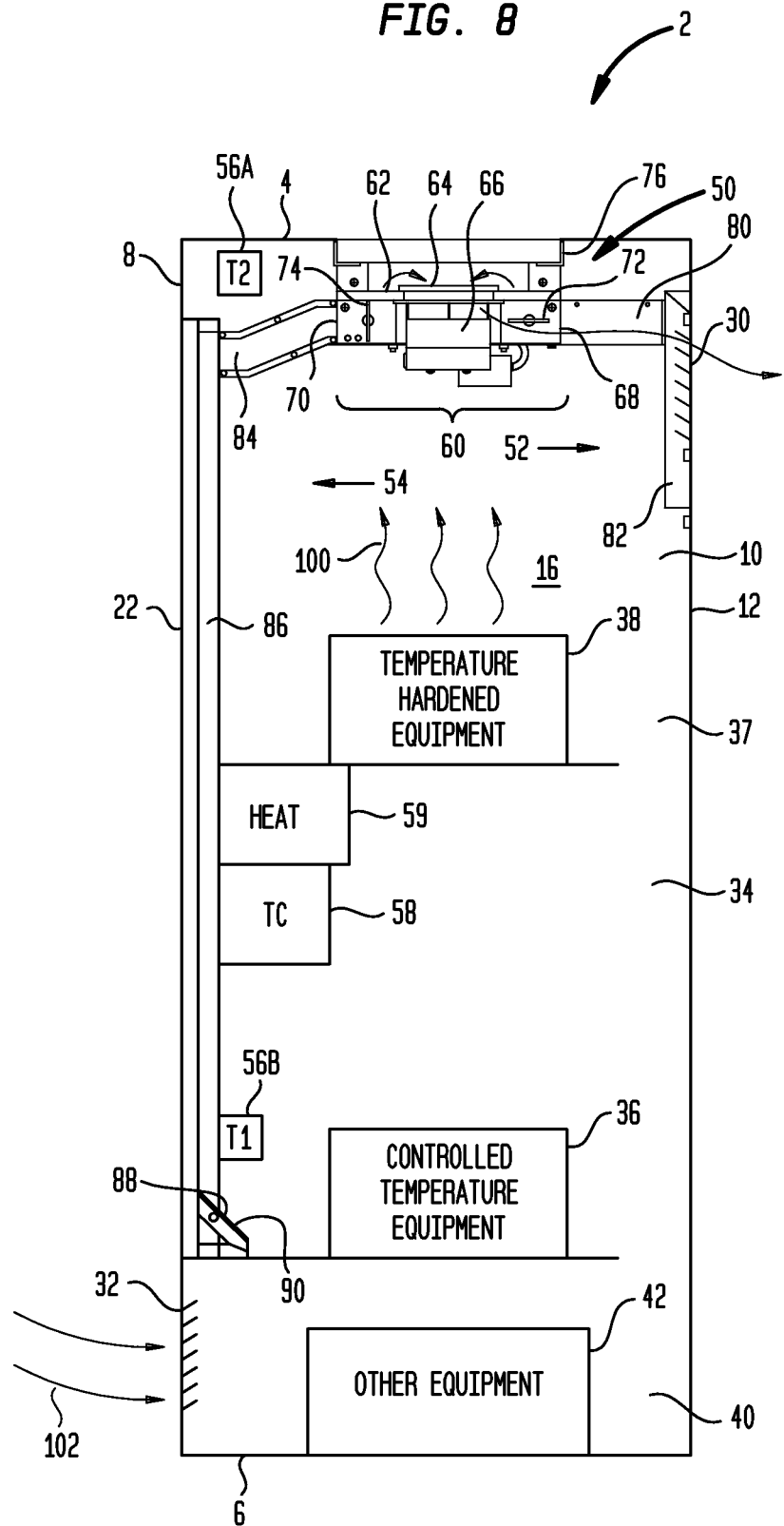
FIG. 8 is cross-sectional view according to FIG. 2 showing the equipment enclosure thereof in a cooling mode of operation.

Turning now to FIG. 8, the respective rotational positions of the dampers 72 and 74 are set for maximum cooling effect. In this mode, warm air 100 inside the enclosure 2 is captured by the temperature diverter system 50, then directed to the warm air exhaust subsystem 52 and through the air exhaust opening 30 in order to cool the controlled temperature area 34. The warm air 100 will typically be generated by the thermal output of the controlled temperature equipment 36 and/or the temperature hardened equipment 38, as well as from external heating of the equipment enclosure 2 due to external environmental conditions. For example, if the equipment enclosure 2 is situated at an outdoor location, the enclosure may be heated by outside air temperatures as well as direct exposure to the sun's radiant energy. Due to natural convection, the warm air 100 will tend to rise through the equipment enclosure's interior equipment chamber 16. This upward movement may be assisted by outside air 102 being drawn into the interior equipment chamber 16 through the air intake opening 32 and pulled toward the top of the equipment enclosure 2 due to outflow through the air exhaust opening 30. As the warm air 100 flows upwardly through the equipment enclosure 2, it will be drawn by the fan 66 into the air receiver unit 60 of the temperature diverter system 50. As previously mentioned, the fan 66 will redirect the air radially outwardly toward the exhaust discharge ports 68 and 70 of the air receiver unit's plenum structure 62. However, as can be seen in FIG. 8, the damper 74 is in a closed position that blocks the discharge port 70 while the damper 72 is in an open position that opens the discharge port 68. In this damper configuration, all of the warm air 100 entering the temperature diverter system 50 is pushed by the fan 66 (at relatively high pressure) through the air exhaust opening 30 and out of the equipment enclosure 2. This tends to cool the equipment enclosure 2, particularly given that the fresh outside air 102 is simultaneously being drawn into the interior equipment chamber 16 via the air intake opening 32.

Figure 9:
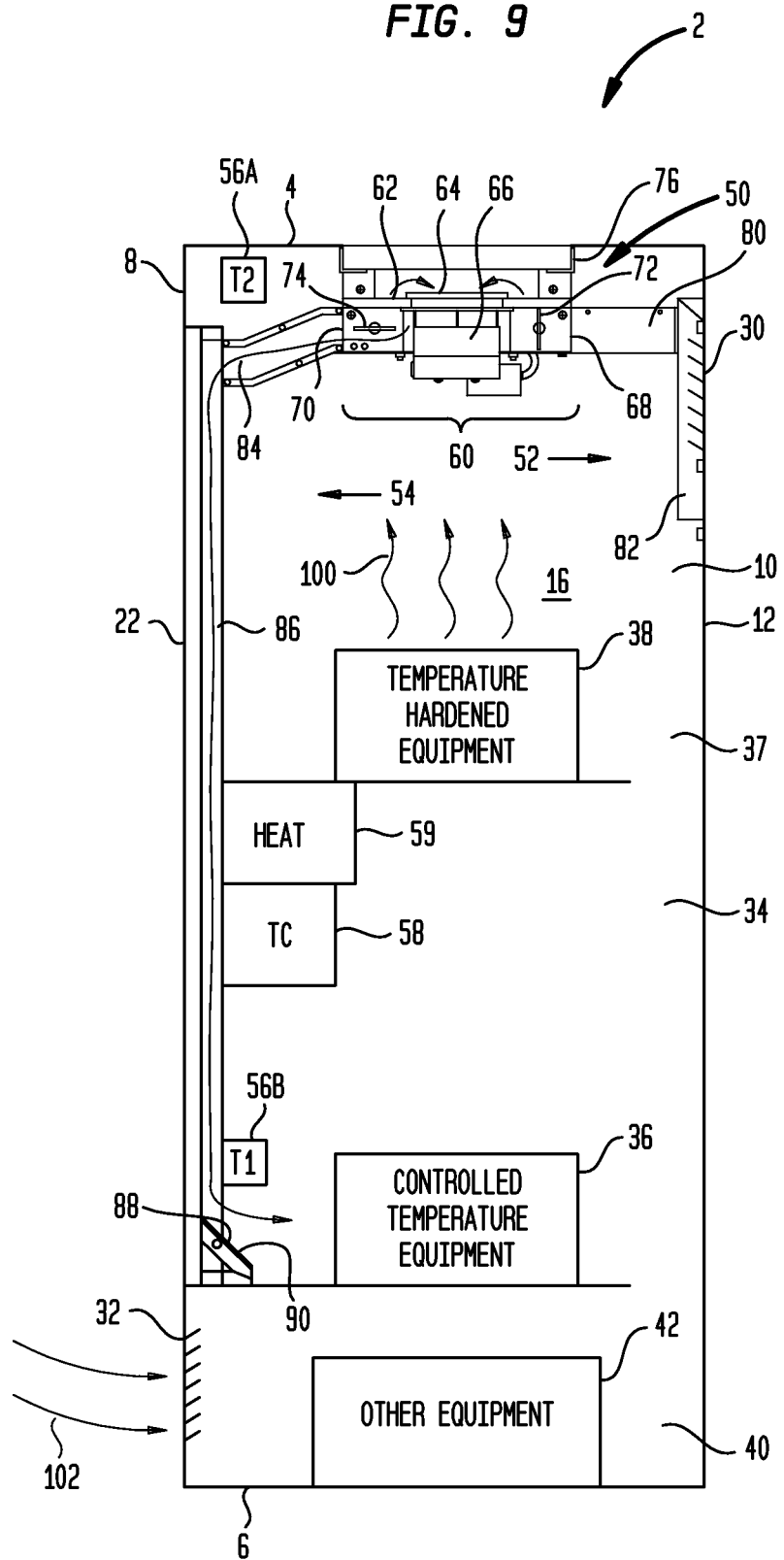
FIG. 9 is cross-sectional view according to FIG. 2 showing the equipment enclosure thereof in a heating mode of operation.

Turning now to FIG. 9, the respective rotational positions of the dampers 72 and 74 are set for maximum warming effect. In this mode, the warm air 100 inside the enclosure 2 is directed to the warm air circulation subsystem 54 and through the circulation discharge opening 88 situated in the controlled temperature equipment area 34. As can be seen, the damper 72 is in a closed position that blocks the discharge port 68 while the damper 74 is in an open position that opens the discharge port 70. In this damper configuration, all of the warm air 100 entering the temperature diverter system 50 is pushed by the fan 66 (at relatively high pressure) through the circulation discharge opening 88 in order to bath the controlled temperature equipment 36 with warm air. This tends to maintain heat within the equipment enclosure 2 even though the outside temperature may be below the preferred temperature range of the controlled temperature equipment 36.

Figure 10:
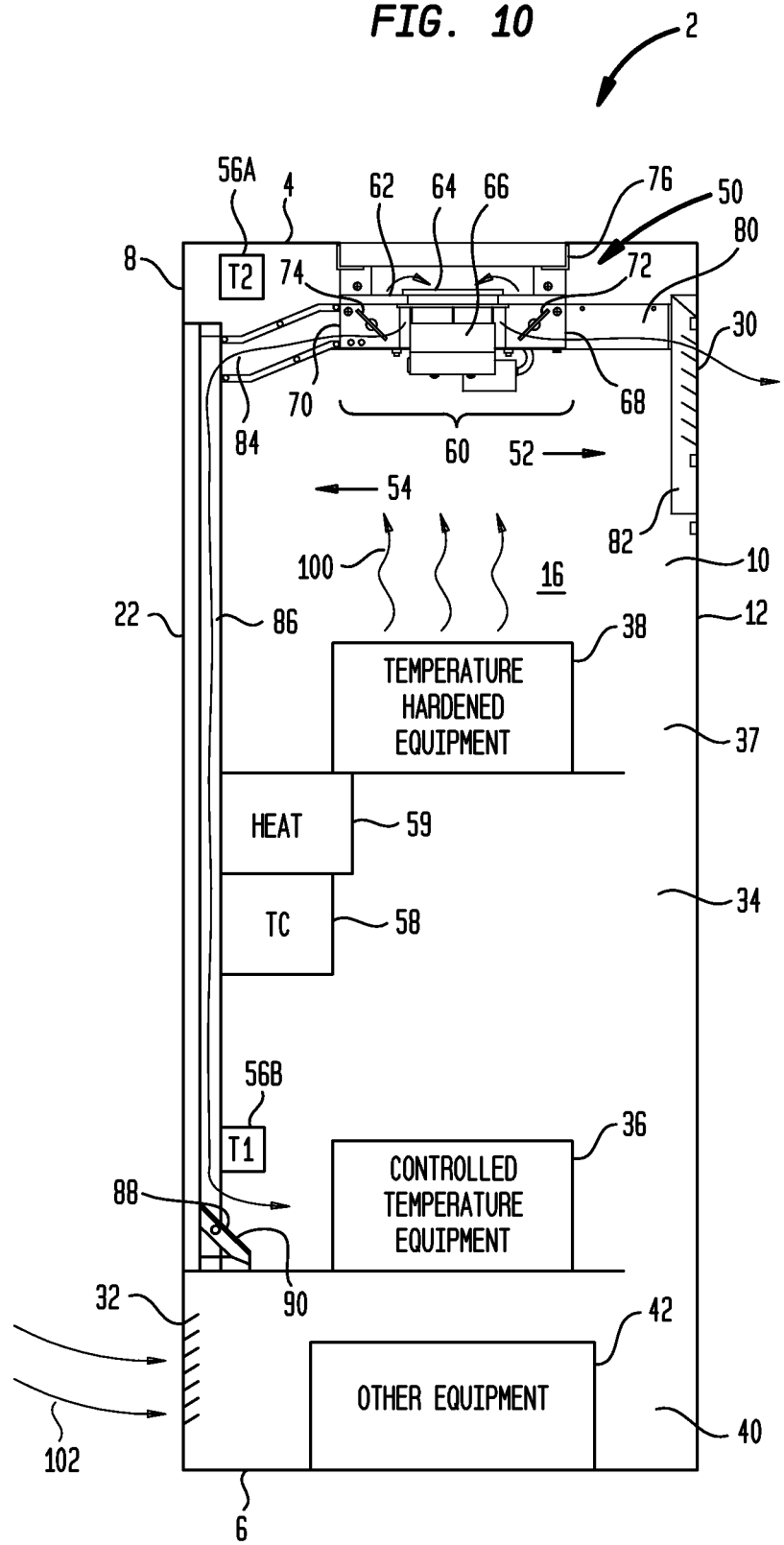
FIG. 10 is cross-sectional view according to FIG. 2 showing the equipment enclosure thereof in a cooling/heating mode of operation.

Turning now to FIG. 10, the respective rotational positions of the dampers 72 and 74 are set for a combined heating and cooling effect in order to achieve more precise control of the temperature within the controlled temperature area 34. In this mode, the warm air 100 inside the enclosure 2 is directed into both the warm air exhaust subsystem 52 and the warm air circulation subsystem 54. As can be seen, both of the dampers 72 and 74 are in a partially open position. In this damper configuration, some of the warm air 100 entering the temperature diverter system 50 is pushed by the fan 66 through the circulation discharge opening 88 in order to bath the controlled temperature equipment 36 with warm air. At the same time, some of the warm air 100 is pushed by the fan 66 out the air exhaust opening 30. As previously mentioned, the damper motors 72A and 74B may be designed to respectively rotate the dampers 72 and 74 through a number of adjustment positions (e.g., nine positions each). By selectively adjusting the respective positions of the dampers 72 and 74 to balance warm air exhaust and circulation, very precise temperature control can be maintained over the controlled temperature equipment 36.

Figure 11:
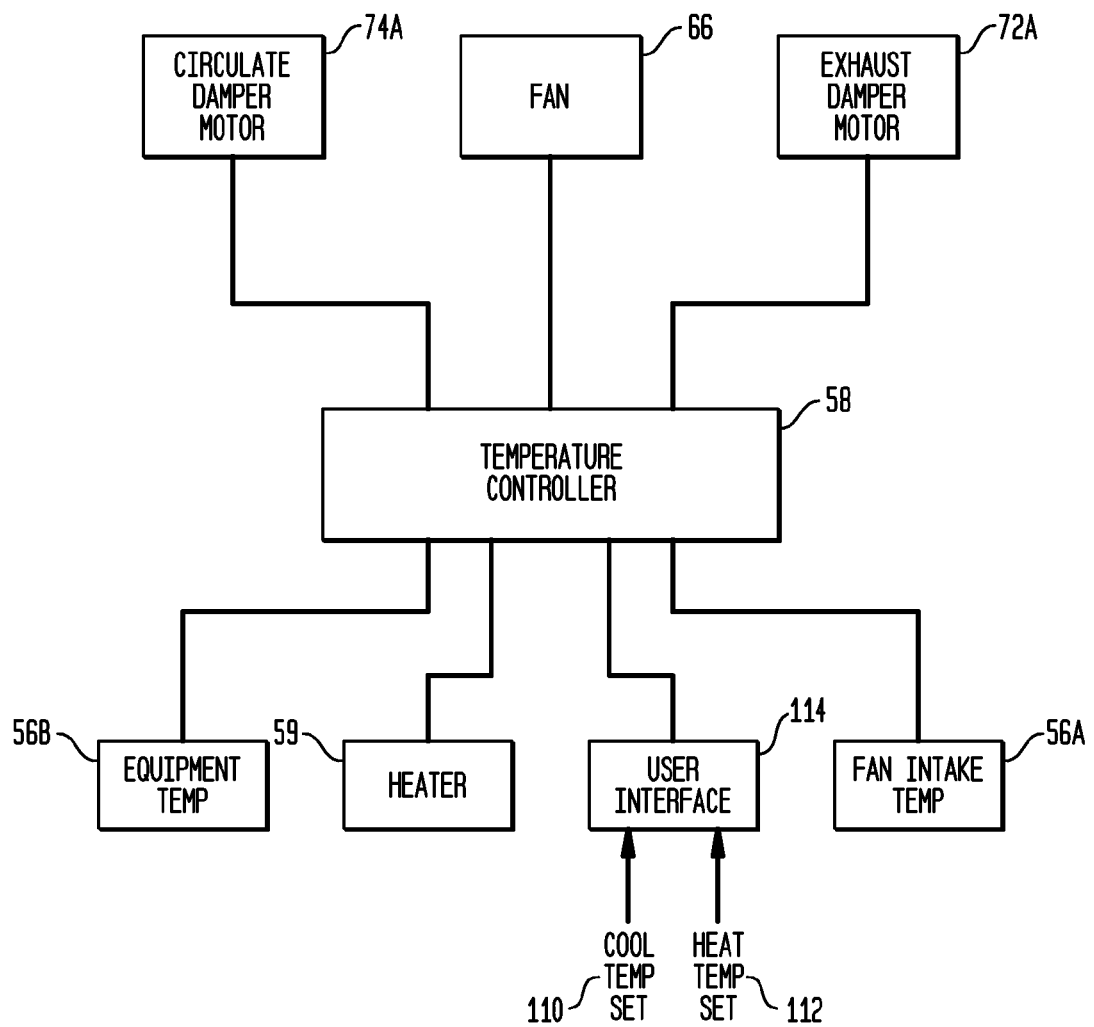
FIG. 11 is a functional block diagram showing example components of the temperature diverter system of FIG. 3 and additional temperature control components that operate in conjunction therewith.

Turning now to FIG. 11, the temperature controller 58 and the components that it interacts with are shown. In the illustrated embodiment, the control outputs of the temperature controller 58 are the heater 59, the fan 66, the exhaust damper motor 72A, and the circulate damper motor 74A. The control inputs of the temperature controller 58 in the illustrated embodiment are the fan temperature sensor 56A and the equipment temperature sensor 56B. The former is positioned to measure the intake temperature of the fan 66 at the top of the interior equipment enclosure 16 and the latter is positioned to measure the equipment temperature in the controlled temperature equipment area 34. The temperature controller 58 may also receive programming inputs such as a cool temperature setting 110 and a heat temperature setting 112. As described in more detail below in connection with FIG. 12, the temperature settings 110 and 112 are used to control the operation of the fan 66 and the heater 59 when temperatures within the equipment enclosure 2 reach specified high or low levels. The cool temperature setting 110 specifies the temperature that triggers fan operation when the temperature diverter 50 is attempting to cool the equipment enclosure 2. The heat temperature setting 112 specifies the temperature that triggers the heater 59 in order to heat the equipment enclosure 2. A suitable user interface 114, such as a touchpad or the like, may be provided for allowing equipment support personnel to change the temperature settings 110 and 112. It will be appreciated that the various devices that provide inputs to or receive outputs from the temperature controller 58 may communicate with the controller in any desired manner, including by way of wireline and wireless connections.

Figure 12:
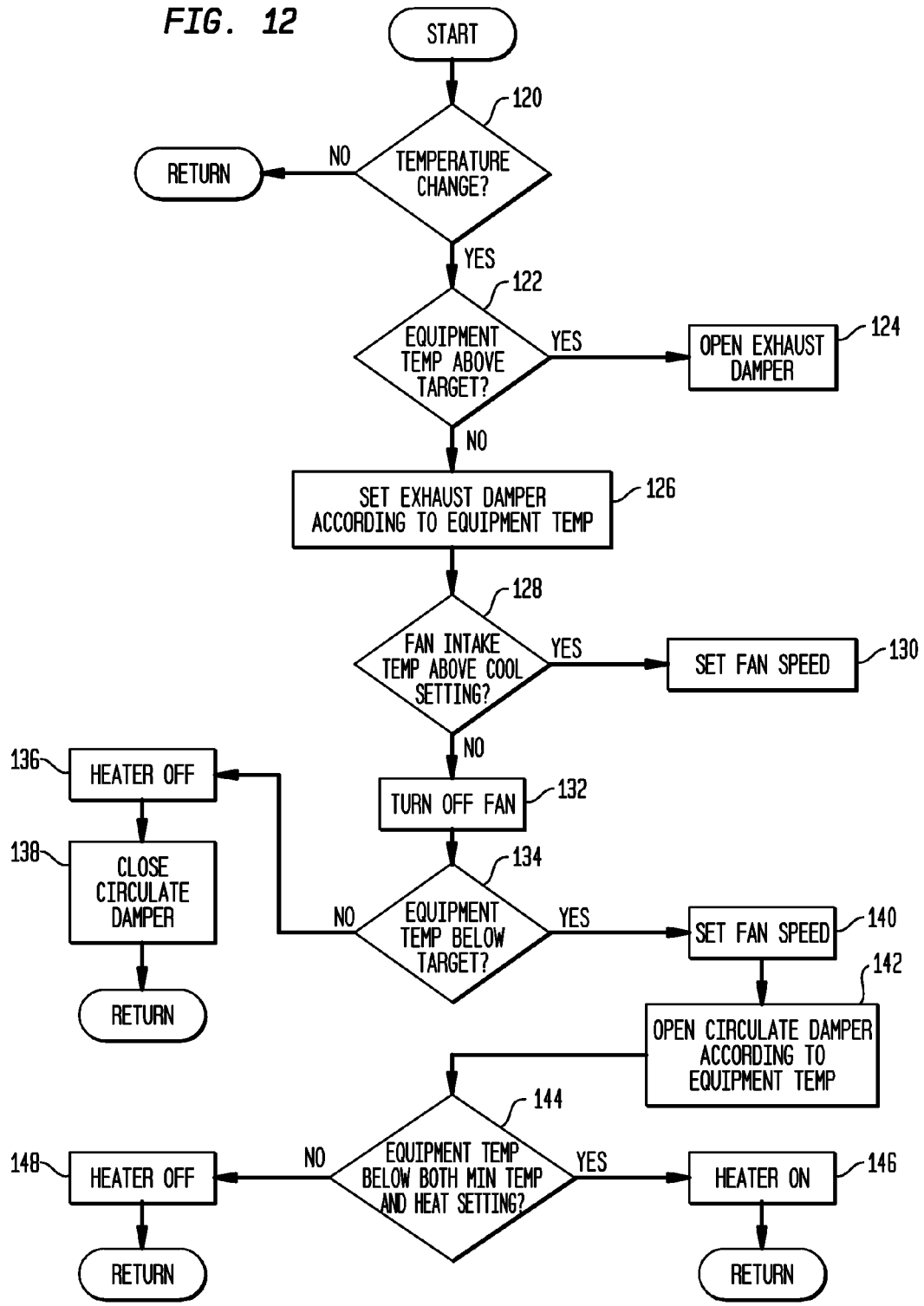
FIG. 12 is a flow diagram showing example operations that may be performed by the components of FIG. 11.

Turning now to FIG. 12, an example control routine that may be implemented by the temperature controller 58 is shown. It should be understood that the illustrated control routine is exemplary only, and that other control routines could be implemented by the temperature controller 58 according to application requirements or preferences. The overall goal of the illustrated control routine is to adjust the configuration of the temperature diverter's warm air exhaust subsystem 52 and warm air circulation subsystem 54 in response to changing temperature conditions within the equipment enclosure 2. In an example embodiment, the temperature controller 58 may be configured to implement the control routine on a periodic basis, such every few seconds, every few minutes, etc.

At the outset of the control routine, temperature readings from the temperature sensors 56A and 56B are sampled and stored, and then compared against stored temperature readings obtained during the last iteration of the control routine. The control routine returns with no further processing if neither temperature reading has changed. On the other hand, if either the fan temperature sensor 56A or the equipment temperature 56B reports a changed temperature value, processing proceeds to block 122. In block 122, the equipment temperature reading sampled from the equipment temperature sensor 56B is compared to a stored target temperature value maintained by the temperature controller 58. Typically, the target temperature value will be the optimal operating temperature of the controlled temperature equipment 36. In many cases, this will be normal room temperature, such as 20 degrees C. (68 degree F.). If block 122 determines that the equipment temperature is above the target temperature, the temperature controller 58 implements block 124 in which it issues a control signal to the exhaust damper motor 74A to open the exhaust damper 74 to its maximum open position. If the equipment temperature does not exceed the target temperature in block 122, processing proceeds to block 126.

In block 126, the temperature controller 58 issues a control signal to the exhaust damper motor 72A to adjust the exhaust damper 72 according to the measured equipment temperature. In an example embodiment, the position of the exhaust damper 72 is determined by comparing the equipment temperature to a stored minimum temperature value representing the temperature at which the exhaust damper will be fully closed so that none of the warm air 100 in the equipment enclosure 2 is exhausted from the interior equipment chamber 16. Typically, the stored minimum temperature value will represent the lower end of the preferred temperature range of the controlled temperature 36. For example, this could be a temperature of 16 degrees C. (60.8 degree F.).

If the equipment temperature is at or below the stored minimum temperature value, the temperature controller 58 issues a control signal to the exhaust damper motor 72A that results in the exhaust damper 72 being closed. If the equipment temperature is above the stored minimum temperature value, the temperature controller 58 performs a calculation to determine the exhaust damper setting and issues a corresponding control signal to the exhaust damper motor 72A. In an example embodiment, the exhaust damper calculation determines the difference between the measured equipment temperature and the stored minimum temperature, then sets the exhaust damper position based on that value. A larger differential will open the exhaust damper 72 wider than a smaller differential, thus achieving the desired effect of exhausting increasingly greater amounts of the warm air 100 from the equipment enclosure 2 as the equipment temperature rises.

In block 128, the fan intake temperature reading sampled from the fan temperature sensor 56A is compared to the cool temperature setting 110 discussed above in connection with FIG. 11. If the fan intake temperature is above the cool temperature setting 110, the temperature controller 58 performs a calculation to determine a fan speed and issues a corresponding control signal to the fan 66 in block 130. In an example embodiment, the fan speed calculation determines the difference between the fan intake temperature and the cool temperature setting 110, then sets the fan speed based on that value. A larger differential will set the fan speed to a higher level than a smaller differential, thus achieving the desired effect of providing additional cooling by using the fan 66 to help exhaust the warm air 100 from the equipment enclosure 2 as the fan intake temperature rises. If the fan intake temperature is not above the cool temperature setting 110 in block 128, a fan turn-off control signal is sent to the fan 66 in block 132.

In block 134, the equipment temperature reading sampled from the equipment temperature sensor 56B is again compared to a stored target temperature value maintained by the temperature controller 58 to determine if the measured equipment temperature is below the target temperature. This is the same target temperature value discussed above in connection with block 122 wherein the determination was whether the equipment temperature is above the target temperature. If the equipment temperature is not below the target temperature value (e.g., 20 degrees C., 68 degrees F.), the temperature controller 58 sends a heater turn-off control signal to the heater 59 in block 136 to ensure that the heater is in a heater off mode. The temperature controller 58 also sends a control signal to the circulate damper motor 74A in block 138 to ensure that the circulate damper 74 is closed. The control routine then returns without further processing.

If block 134 determines that the equipment temperature is below the stored target temperature value, the temperature controller 58 activates the fan 66 in block 140 and opens the circulate damper 74 in block 142 in order to circulate some of the warm air 110 to the controlled equipment area 34. Note that these adjustments may be made while the exhaust damper 74 is also open so long as the equipment temperature is not below the stored minimum temperature used to calculate the exhaust damper opening in bock 126. To set the fan speed in block 140, the temperature controller 58 issues a control signal to set the fan 66 at a preset speed (usually a slow speed setting). To adjust the position of the circulate damper 74, the temperature controller performs a calculation to determine the difference between the equipment temperature and the stored target temperature, then issues a corresponding control signal to the circulate damper motor 74A. A larger differential will open the circulate damper 74 wider than a smaller differential, thus achieving the desired effect of circulating increasingly greater amounts of the warm air 100 to the controlled temperature equipment area 34 as the equipment temperature falls.

In block 144, the temperature controller 58 compares the equipment temperature reported by the equipment temperature sensor 56B with both the stored minimum temperature setting and the user-selected heat temperature setting 112. If the equipment temperature is less than both values, the temperature controller 58 sends a heater-on control signal to the heater 59 in block 146. If the equipment temperature is not less than both temperature values, the temperature controller 58 sends a heater-off control signal to the heater 59 in block 148 to ensure that it is switched off. The control routing returns after performing either of blocks 146 or 148, with no further processing.

Figure 13:
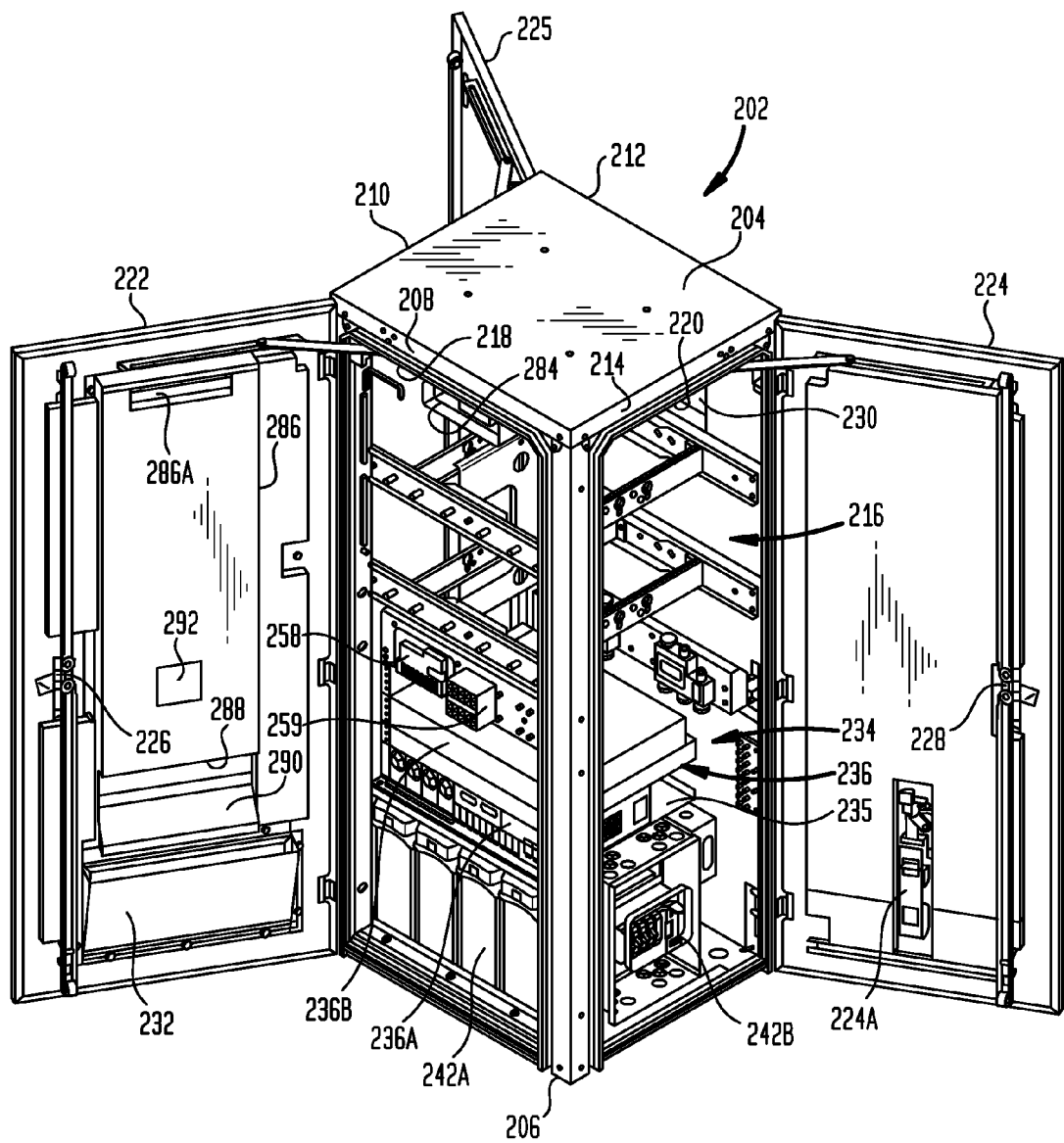
FIG. 13 is a perspective view showing another example equipment enclosure that may be constructed according to the present disclosure.
Figure 14:
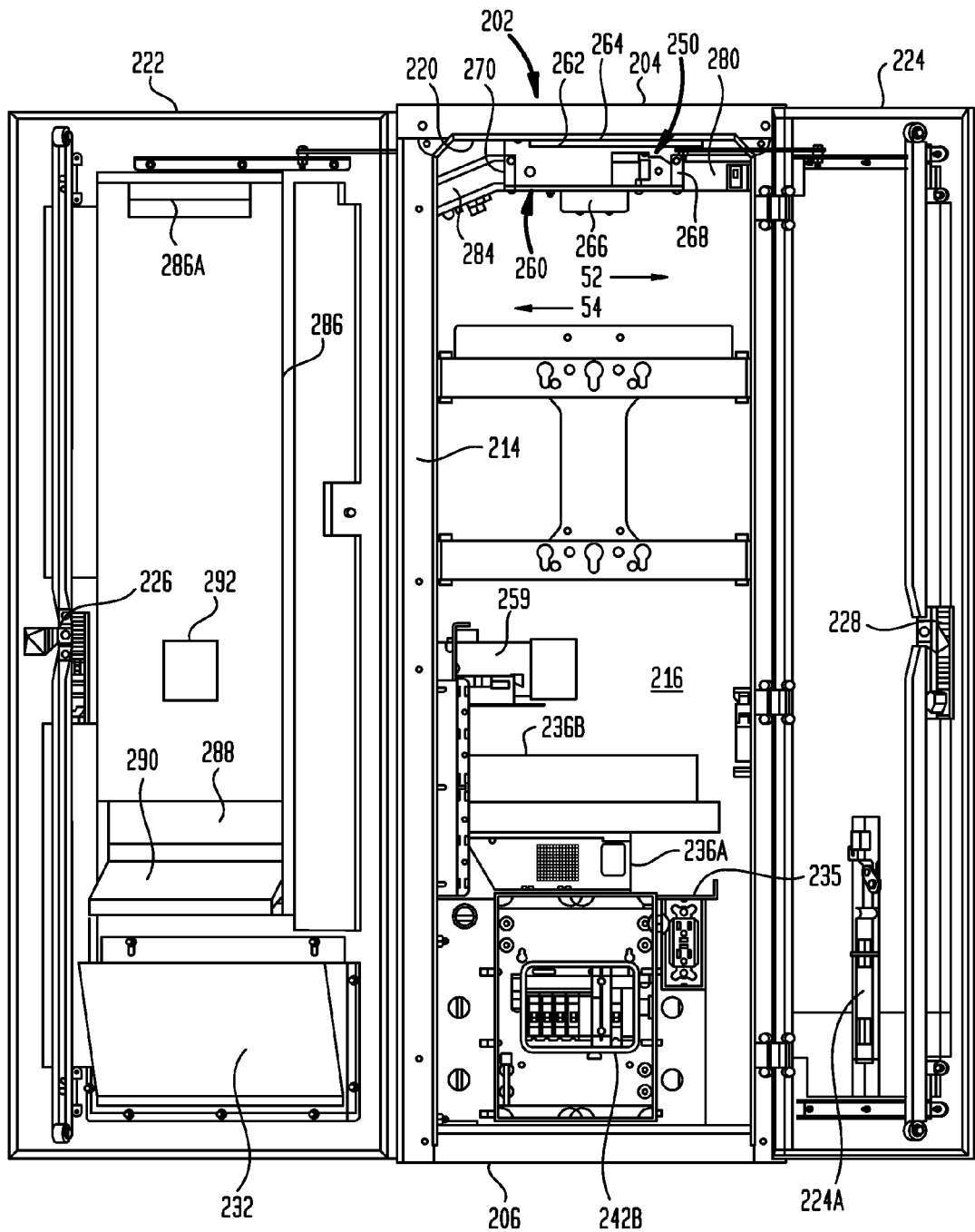
FIG. 14 is a side elevation view of the equipment enclosure of FIG. 13.

Turning now to FIGS. 13 and 14, an example equipment enclosure 202 represents an embodiment of the equipment enclosure 2 that is designed for outdoor use at an electrical equipment site, namely, a base station subsystem (BSS) comprising the equipment enclosure 202 and a cellular telephone antenna tower (not shown). In this application, the primary function of the equipment enclosure 202 is to power a radio transceiver that handles wireless voice and data communications in a cellular telephone network. Most of the components illustrated in the equipment enclosure 202 of FIGS. 13-14 find correspondence in the equipment enclosure 2 of FIG. 1 et seq. This correspondence between components is indicated by the use of corresponding reference numbers, with the reference numbers of FIGS. 13-14 being incremented by 200.

For example, the cellular equipment enclosure 202 may be configured with a top panel 204, a bottom panel 206 and four side panels 208, 210, 212 and 214 that define an interior equipment chamber 216. Three of the side panels, i.e., side panels 208, 210 and 214, are formed with openings that allow access to the interior equipment chamber 16. For example, FIG. 13 illustrates a first access opening 218 formed on side panel 208 and a second access opening 220 formed on side panel 214. Although not shown, side panel 210 also has an access opening that may have the same configuration as the access opening 220. A first service door 222 covers access opening 218 and a second service door 224 covers access opening 220. A third service door 225 covers the access opening in side panel 210. The service doors 222 and 224 are mounted to the equipment enclosure 202 using hinges and are respectively opened using door handles 226 and 228 (to activate associated latch mechanisms). The service door 225 is similarly mounted and configured.

Although barely visible in FIG. 13, the louvered air exhaust opening 230 of the cellular equipment enclosure 202 is disposed at an upper region of the panel 212. A louvered air intake opening 232 is disposed at a lower region of the service door 222. The controlled temperature equipment area 234 of the cellular equipment enclosure 202 is located above a mounting platform 235 that supports the temperature controlled equipment 236. In this embodiment, the temperature controlled equipment 236 comprises a DC power supply 236A and a radio device 236B adapted for cellular communication. For ease of illustration, no temperature hardened equipment is shown in FIGS. 13-14. Other equipment within the cellular equipment enclosure includes a set of backup batteries 242A and an electrical service panel 242B. The service panel 242B is adapted for connection to a main power source (not shown) in order to receive main power therefrom. The power supply 236A is operatively connected to receive main power from the service panel 242B and deliver it to the radio device 236B. A power cutoff mechanism 224A on the service door 224 is provided to enable service personnel to switch off a main power breaker of the service panel 242B from outside the cellular equipment enclosure 202 while the service door 224 is closed.

As can be seen in both FIGS. 13 and 14, the temperature diverter system 250 is disposed mainly within the interior equipment chamber 216 of the cellular equipment enclosure 202. However, the warm air circulation subsystem 254 has components both within the interior equipment chamber 216 and on the service door 222. In particular, the first circulation plenum 284 is mounted within the interior equipment chamber 216. The second circulation plenum 286, the discharge opening 288 and the angled flow diverter plate 290 are mounted on the inside of the service door 222. An opening 286A at the upper end of the second circulation plenum 286 engages the open left-hand end of the first circulation plenum 284. It will also be seen in FIGS. 13 and 14 that the heater 259 is mounted in the interior equipment chamber 216 at a location that is aligned with the position of a heater opening 292 in the second circulation plenum 286. This allows the heater 259 to blow warm air into the warm air circulation subsystem 254 when the temperature diverter system 50 is in heating mode. As further shown in FIG. 13, the temperature controller 258 may be conveniently mounted next to the heater 259 in the controlled temperature area 234 to simplify the controller's wiring connections.

Accordingly, an equipment enclosure with an air diverter temperature control system has been disclosed. Although various embodiments have been described, it should be apparent that many variations and alternative embodiments could be implemented in accordance with the inventive concepts disclosed herein. For example, FIG. 15 illustrates a more generic equipment enclosure 302 that comprises an enclosure housing 304 of unspecified shape and size, an interior equipment chamber 316, an air exhaust opening 330 disposed at a first region of the equipment enclosure and an air intake opening 332 disposed at a second region of the equipment enclosure. The interior equipment chamber 316 has a controlled temperature equipment area 334 may be used to house controlled temperature equipment 336. The interior equipment chamber 316 also has another equipment area 337 that may be used to house temperature hardened equipment 338. A temperature diverter system 350 includes a warm air exhaust subsystem 352 and a warm air circulation subsystem 354. The warm air exhaust subsystem 352 is operable to vent warm air in the equipment enclosure 302 through the air exhaust opening 330 in order to cool the controlled temperature equipment area 324. The warm air circulation subsystem 354 is operable to circulate warm air in the equipment enclosure 302 to the controlled temperature equipment area 324 in order to warm that area. The equipment enclosure 302 further includes one or more temperature sensors (such as sensors 356A and 356B) and a temperature controller 358. The temperature controller 358 controls operations of the warm air exhaust subsystem 352 and the warm air circulation system 354 based on input from the one or more temperature sensors 356A and 356B. In this embodiment, the subsystems 352 and 354 share a common air mover 366 (such as a fan) that draws warm air into the temperature diverter system 350. The air exhaust subsystem 352 further includes a movable damper 372 that regulates the flow of warm air to the exhaust outlet 330 via a closed air pathway 352A. The air circulate subsystem 352 further includes a movable damper 374 that regulates the flow of warm air to the controlled temperature equipment area 324 via a closed air pathway 354A. The temperature controller 358 may control the operation of the air mover 366 and the position of the dampers 372 and 374 using a control routine such as the one described above in connection with FIG. 12 (or by using other control routines). Although not shown, a heater may also be provided as discussed above in connection with previous embodiments.

FIG. 16 illustrates a further equipment enclosure 402 that shares many of the same components as the equipment enclosure 302, as indicated by the of corresponding reference number incremented by 100. The equipment enclosure 402 differs from the equipment enclosure 302 in that the dampers 472 and 474 of the temperature diverter system 450 are interlinked so that as one damper is closing the other is opening, and visa versa. This simplifies the temperature controller logic and may reduce cost.

FIG. 17 illustrates a further equipment enclosure 502 that shares many of the same components as the equipment enclosure 302, as indicated by the of corresponding reference number incremented by 200. The equipment enclosure 502 differs from the equipment enclosure 502 in that the air exhaust subsystem 552 and the warm air circulation subsystem 554 have independent fans 566A and 566B, respectively. No dampers are used. The temperature controller 558 implements a control program that controls the speed of each fan 556A and 556B to selectively flow warm air that collects at the top of the equipment enclosure housing 504 toward the air exhaust opening 530 and toward the controlled temperature area 524 (via a closed pathway 554A).

FIG. 18 illustrates a further equipment enclosure 602 that shares many of the same components as the equipment enclosure 502, as indicated by the of corresponding reference number incremented by 100. The equipment enclosure 602 differs from the equipment enclosure 502 in that the air exhaust subsystem 552 includes a spring loaded damper 672 in addition to the fan 666A. The damper 672 opens in response to the fan 666A forcing warm air toward the air exhaust opening 630, then closed when the fan 666A is turned off and the fan 666B is turn on to recirculate warm air to the controlled temperature area. The damper 672 prevents warm air from venting through the air exhaust opening 630 during warming.

In each of the foregoing embodiments, it will be appreciated that the temperature diverter system may include additional air pathways to direct warm air collected at one area of the equipment enclosure to other areas of the enclosure. Thus, in addition to a warm air exhaust subsystem and a warm air circulation subsystem, the temperature diverter system could have other subsystems that direct warm air to any location that will provide a desired heating or cooling effect. The warm air will typically be collected from a warmest point of the equipment enclosure to achieve maximum warming or cooling effect. This warm air collection point will typically be at the top of the equipment enclosure, but could also be at other locations. Although not required, the use of a centrifugal fan as an air mover at the warm air intake of the temperature diverter system can be advantageous. Such fans have the ability to draw in warm air in one direction (e.g., downwardly, upwardly, laterally, etc.) and redirect it radially outwardly at increased pressure. This pressurized outwardly directed warm air may then be fed into two or more warm air exhaust and/or distribution subsystems for selective delivery to any desired area of the equipment enclosure.

In view of the many different ways that the disclosed subject matter may be embodied, should be understood that the invention is not to be in any way limited except in accordance with the spirit of the appended claims and their equivalents.

What is claimed is:

1. An equipment enclosure, comprising:
   an air exhaust opening disposed at a first region of said equipment enclosure;
   an air intake opening disposed at a second region of said equipment enclosure;
   an interior equipment chamber configured to house controlled temperature equipment at a controlled temperature equipment area therein;
   a temperature diverter system, said air diverter system comprising:
   a warm air exhaust subsystem operable to vent warm air collected at a top of said equipment enclosure through said air exhaust opening in order to cool said controlled temperature equipment area; and
   a warm air circulation subsystem operable to circulate warm air collected at said top of said equipment enclosure to said controlled temperature equipment area in order to warm said controlled temperature equipment area;
   said temperature diverter system comprising either (1) a common air mover that is shared by said warm air exhaust subsystem and said warm air circulation subsystem, with said warm air exhaust subsystem comprising a first movable damper and said warm air circulation subsystem comprising a second movable damper, each said damper being mechanically connected to a damper motor implemented as a multi-position stepper motor that selectively positions said damper through a range of positions so that said warm air collected at said top of said equipment enclosure is selectively directed by said common air mover to said warm air exhaust system and said warm air circulation system, or (2) a first air mover for said warm air exhaust subsystem and a second air mover for said warm air circulation subsystem, said first air mover and said second air mover being controllable so that said warm air collected at said top of said equipment enclosure is selectively directed by said first air mover and said second air mover to said warm air exhaust system and said warm air circulation system;
   one or more temperature sensors; and
   a digital temperature controller implementing a control routine for controlling operations of said warm air exhaust subsystem and said warm air circulation subsystem based on input from said one or more temperature sensors.

2. The equipment enclosure of claim 1, wherein said air exhaust opening is located above said air intake opening.

3. The equipment enclosure of claim 2, wherein said controlled temperature equipment area is disposed below said air exhaust opening and above said air intake opening.

4. The equipment enclosure of claim 1, wherein said temperature diverter system comprises one or more fans.

5. The equipment enclosure of claim 1, wherein said temperature diverter system comprises one or more dampers.

6. The equipment enclosure of claim 1, wherein said temperature diverter system comprises one or more air movers and one or more dampers.

7. The equipment enclosure of claim 1, wherein said warm air exhaust subsystem comprises an air mover that receives warm air in said equipment enclosure and directs it to said air exhaust opening via a warm air exhaust plenum mounted to said equipment enclosure.

8. The equipment enclosure of claim 7, wherein said warm air exhaust plenum provides a closed air pathway from said air mover to said air exhaust opening.

9. The equipment enclosure of claim 1, wherein said warm air circulation subsystem comprises an air mover that receives warm air in said equipment enclosure and directs it to said controlled temperature equipment area via a warm air circulation plenum mounted to said equipment enclosure.

10. The equipment enclosure of claim 9, wherein said warm air circulation plenum provides a closed air pathway from said air mover to said controlled temperature equipment area.

11. The equipment enclosure of claim 10, wherein said closed pathway is disposed at least in part on a door of said equipment enclosure.

12. The equipment enclosure of claim 1, wherein said temperature diverter system comprises a warm air receiver unit comprising a box-shaped plenum structure disposed at a warm air collecting area of said interior equipment chamber proximate to a closed top panel of said equipment enclosure, said common air mover being mounted at an upper air receiving port in said box-shaped plenum structure to receive warm air from said warm air collecting area, said common air mover being shared by said warm air exhaust subsystem and said warm air circulation subsystem and comprising a radial fan that draws air downwardly from said upper air receiving port into a central interior region of said box-shaped plenum structure, then redirects said air through an angle of approximately 90 degrees so that it flows radially outwardly toward respective warm air exhaust and circulation discharge ports of said box-shaped plenum structure, and further wherein said warm air exhaust subsystem comprises said first movable damper disposed within said box-shaped plenum structure proximate to said warm air exhaust discharge port, and said warm air circulation subsystem comprises said second movable damper disposed within said box-shaped plenum structure proximate to said warm air circulation discharge port.

13. The equipment enclosure of claim 12, wherein said first and second movable dampers are powered by separate motors mounted on said box-shaped plenum structure.

14. The equipment enclosure of claim 1, wherein said temperature diverter system comprises said first air mover for said warm air exhaust subsystem and said second air mover for said warm air circulation subsystem.

15. The equipment enclosure of claim 14, wherein said warm air exhaust subsystem further comprises a movable spring loaded damper.

16. A method for controlling temperature in an equipment enclosure,
    said equipment enclosure comprising:
        an air exhaust opening disposed at an upper region of said equipment enclosure;
        an air intake opening disposed at a lower region of said equipment enclosure;
        an interior equipment chamber configured to house controlled temperature equipment at a controlled temperature equipment area therein;
        a temperature diverter system, said temperature diverter system comprising:
            a warm air exhaust subsystem operable to vent warm air collected at a top of said equipment enclosure through said air exhaust opening in order to cool said controlled temperature equipment area;
            a warm air circulation subsystem operable to circulate warm air collected at said top of said equipment enclosure to said controlled temperature equipment area in order to warm said controlled temperature equipment area;
            said temperature diverter system comprising either (1) a common air mover that is shared by said warm air exhaust subsystem and said warm air circulation subsystem, with said warm air exhaust subsystem comprising a first movable damper and said warm air circulation subsystem comprising a second movable damper, each said damper being mechanically connected to a damper motor implemented as a multi-position stepper motor that selectively positions said damper through a range of positions so that said warm air collected at said top of said equipment enclosure is selectively directed by said common air mover to said warm air exhaust system and said warm air circulation system, or (2) a first air mover for said warm air exhaust subsystem and a second air mover for said warm air circulation subsystem, said first air mover and said second air mover being controllable so that said warm air collected at said top of said equipment enclosure is selectively directed by said first air mover and said second air mover to said warm air exhaust system and said warm air circulation system;
        one or more temperature sensors; and
        a digital control subsystem implementing a control routine for controlling operations of said warm air exhaust subsystem and said warm air circulation system based on input from said one or more temperature sensors;
    said method comprising:
        obtaining a temperature measurement from a temperature sensor located in said controlled temperature equipment area; and
        controlling said warm air exhaust subsystem to vent warm air if said temperature measurement is too high and controlling said warm air circulation subsystem to circulate air to said controlled temperature area if said temperature measurement is too low.

17. The method of claim 16, further including controlling both said warm air exhaust system and said warm air circulation system to achieved a desired temperature in said controlled temperature area.

18. The method of claim 16, wherein said temperature diverter system comprises one or more dampers, and wherein said controlling comprises selectively positioning said one or more dampers.

19. The method of claim 16, wherein said temperature diverter system comprises one or more air movers, and wherein said controlling comprises selectively controlling a speed of said one or more air movers.

20. The method of claim 19, wherein said temperature diverter system comprises one or more heaters, and wherein said controlling comprises selectively controlling said one or more heaters.

21. An equipment enclosure, comprising:
    an air exhaust opening disposed at an upper region of said equipment enclosure;
    an air intake opening disposed at a lower region of said equipment enclosure;
    an interior equipment chamber configured to house controlled temperature equipment at a controlled temperature equipment area therein;
    warm air exhaust means for venting warm air collected at a top of said equipment enclosure through said air exhaust opening in order to cool said controlled temperature equipment area;
    warm air circulation means for circulating warm air collected at said top of said equipment enclosure to said controlled temperature equipment area in order to warm said controlled temperature equipment area;
    said warm air exhaust means and said warm air circulation means collectively comprising either (1) common air mover that is shared by said warm air exhaust means and said warm air circulation means, with said warm air exhaust means comprising a first movable damper and said warm air circulation means comprising a second movable damper, each said damper being mechanically connected to a damper motor implemented as a multi-position stepper motor that selectively positions said damper through a range of positions so that said warm air collected at said top of said equipment enclosure is selectively directed by said common air mover to said warm air exhaust means and said warm air circulation means, or (2) a first air mover for said warm air exhaust means and a second air mover for said warm air circulation means, said first air mover and said second air mover being controllable so that said warm air collected at said top of said equipment enclosure is selectively directed by said first air mover and said second air mover to said warm air exhaust means and said warm air circulation means;
    one or more temperature sensors; and
    digital control means for implementing a control routine for controlling operations of said warm air exhaust subsystem and said warm air circulation system based on input from said one or more temperature sensors.

22. An equipment enclosure, comprising:

an interior equipment chamber;

a temperature diverter system, said air diverter system comprising:

a warm air receiver unit comprising a box-shaped plenum structure disposed at a warm air collecting area of said interior equipment chamber proximate to a closed top panel of said equipment enclosure;

two warm air subsystems operable to direct warm air collected by said warm air receiver to two areas of said equipment enclosure in order to provide a desired warming or cooling effect;

a first one of said warm air subsystems being a warm air exhaust system operable to vent warm air collected at said warm air collecting area through an air exhaust opening in a side panel of said equipment enclosure;

a second one of said warm air subsystems being a warm air circulation system operable to vent warm air collected at said warm air collecting area to a controlled temperature equipment area in said equipment chamber where controlled temperature equipment is housed;

said warm air subsystems collectively comprising a common air mover mounted at an upper air receiving port of said box-shaped plenum structure that forms an inlet of said warm air receiver unit, said box-shaped plenum structure further including a warm air exhaust port in fluid communication with said air exhaust opening, and a warm air circulation port in fluid communication with said controlled temperature equipment area, said warm air exhaust port and said warm air circulation port being disposed on opposite sides of said box-shaped plenum structure;

said common air mover being shared by said warm air exhaust system and said warm air recirculation system and comprising a radial fan that draws air downwardly from said upper air receiving port into a central interior region of said box-shaped plenum structure, then redirects said air through an angle of approximately 90 degrees so that it flows radially outwardly toward said warm air exhaust discharge port and said warm air circulation discharge port, with said warm air exhaust system and said warm air circulation system each comprising a movable damper disposed within said box-shaped plenum structure and respectively disposed proximate to said warm air exhaust discharge port and said warm air circulation discharge port, each said damper being mechanically connected to a respective damper motor on said box-shaped plenum structure that selectively positions said damper through a range of positions so that said warm air collected at said warm air collecting area is selectively directed by said common air mover via said warm air exhaust discharge port to said exhaust opening and via said warm air circulation discharge port to said controlled temperature equipment area; and digital temperature control logic operable to implement a control routine to control operations of said warm air subsystems in order to selectively direct warm air to said exhaust opening and said controlled temperature equipment area.

* * * * *